(12) United States Patent
Kersey

(10) Patent No.: US 11,432,385 B2
(45) Date of Patent: Aug. 30, 2022

(54) SINGLE COMPARATOR EXPONENTIAL-SCALE PWM DIMMING

(71) Applicant: Analog Devices, Inc., Norwood, MA (US)

(72) Inventor: Chad D. Kersey, Durham, NC (US)

(73) Assignee: Analog Devices, Inc., Norwood, MA (US)

( * ) Notice: Subject to any disclaimer, the term of this patent is extended or adjusted under 35 U.S.C. 154(b) by 88 days.

(21) Appl. No.: 16/987,719

(22) Filed: Aug. 7, 2020

(65) Prior Publication Data
US 2022/0046774 A1    Feb. 10, 2022

(51) Int. Cl.
| | | |
|---|---|---|
| *H05B 45/325* | (2020.01) | |
| *H03K 3/017* | (2006.01) | |
| *H05B 45/10* | (2020.01) | |
| *H03M 1/66* | (2006.01) | |

(52) U.S. Cl.
CPC ........... *H05B 45/325* (2020.01); *H03K 3/017* (2013.01); *H05B 45/10* (2020.01); *H03M 1/66* (2013.01)

(58) Field of Classification Search
CPC ...... H05B 45/325; H05B 45/10; H03K 3/017; H03M 1/66
See application file for complete search history.

(56) References Cited

U.S. PATENT DOCUMENTS

| | | | |
|---|---|---|---|
| 8,294,379 B2 | 10/2012 | Liu et al. | |
| 8,339,067 B2 | 12/2012 | Lin et al. | |
| 8,405,465 B2 | 3/2013 | Mccune, Jr. | |
| 9,131,581 B1* | 9/2015 | Hsia | H05B 45/375 |
| 9,173,260 B2 | 10/2015 | Ryu et al. | |
| 9,192,007 B2 | 11/2015 | Zhang | |
| 9,661,697 B2 | 5/2017 | Sadwick et al. | |
| 9,859,909 B1* | 1/2018 | Cowan | H03M 1/1235 |
| 10,034,341 B1 | 7/2018 | Hsueh | |
| 10,159,132 B2 | 12/2018 | Woytowitz | |
| 10,378,747 B1* | 8/2019 | Hanslip | F21V 23/06 |
| 10,575,377 B2 | 2/2020 | Eum | |

(Continued)

FOREIGN PATENT DOCUMENTS

| | | | |
|---|---|---|---|
| CN | 102131333 A | * | 7/2011 |
| CN | 106028511 B | * | 12/2017 |

(Continued)

OTHER PUBLICATIONS

"German Application Serial No. 102021119879.8, Office Action dated Mar. 11, 2022", w/o English translation, 6 pgs.

(Continued)

*Primary Examiner* — Adam D Houston
(74) *Attorney, Agent, or Firm* — Schwegman Lundberg & Woessner, P.A.

(57) ABSTRACT

An exponential scale pulse width modulation (PWM) controller comprises a waveform generator circuit configured to generate a logarithmic waveform signal that has the shape of an increasing logarithm function; and a first comparator circuit including a first input to receive the logarithmic waveform signal, a second input to receive an input signal, and an output that provides a PWM control signal that includes signal pulses having a duty cycle that changes exponentially with respect to the input signal.

18 Claims, 4 Drawing Sheets

(56) References Cited

U.S. PATENT DOCUMENTS

| | | | |
|---|---|---|---|
| 2007/0103122 A1* | 5/2007 | Morong | G05F 1/46 |
| | | | 323/205 |
| 2007/0205908 A1* | 9/2007 | Du | G08B 29/181 |
| | | | 340/815.45 |
| 2008/0116827 A1 | 5/2008 | Williams | |
| 2010/0020108 A1 | 1/2010 | Nam et al. | |
| 2010/0045190 A1 | 2/2010 | Cramer | |
| 2010/0308749 A1 | 12/2010 | Liu | |
| 2012/0074860 A1 | 3/2012 | Lee | |
| 2012/0146541 A1* | 6/2012 | Szczeszynski | H05B 45/3725 |
| | | | 315/294 |
| 2013/0193879 A1 | 8/2013 | Sadwick et al. | |
| 2015/0061528 A1 | 3/2015 | Raval et al. | |
| 2015/0340950 A1* | 11/2015 | Wibben | H02M 3/158 |
| | | | 323/288 |
| 2017/0127485 A1* | 5/2017 | Hsia | H05B 45/60 |
| 2020/0077481 A1* | 3/2020 | Niestroj | H05B 45/20 |
| 2021/0410247 A1* | 12/2021 | Herrera | H05B 45/20 |
| 2022/0046774 A1* | 2/2022 | Kersey | H03K 3/017 |

FOREIGN PATENT DOCUMENTS

| | | | | |
|---|---|---|---|---|
| CN | 109640464 A | 4/2019 | | |
| DE | 102004004319 A1 | 8/2004 | | |
| DE | 102021119879 A1 * | 2/2022 | | H03K 3/017 |
| DE | 102021119879 A1 | 2/2022 | | |
| KR | 20090051236 A | 5/2009 | | |
| WO | WO-2014067830 A1 * | 5/2014 | | H05B 45/24 |
| WO | WO-2019185935 A1 | 10/2019 | | |

OTHER PUBLICATIONS

"German Application Serial No. 102021119879.8, Response filed Jun. 30, 2022 to Office Action dated Mar. 11, 2022", w/o English Claims, 48 pgs.

* cited by examiner

```
out := 0;
f := 0;
s := S_HOLDOFF;
initial := true;

do:
    if (f > s):
    out := out + 1; f
    := f - s;
    if (initial): initial
       := false; s :=
       S_INIT;
    f := f + F_STEP; s :=
    s + 1;
while (out != LIMIT || f < s);
```

FIG. 5A

| STEP | f | s | OUT | STEP | f | s | OUT |
|---|---|---|---|---|---|---|---|
| 0 | 0 | 100 | 0 | 16 | 15 | 34 | 2 |
| 1 | 10 | 101 | 0 | 17 | 25 | 35 | 2 |
| 2 | 20 | 102 | 0 | 18 | 35 | 36 | 2 |
| 3 | 30 | 103 | 0 | 19 | 45 | 37 | 2 |
| 4 | 40 | 104 | 0 | 20 | 18 | 38 | 3 |
| 5 | 50 | 105 | 0 | 21 | 28 | 39 | 3 |
| 6 | 60 | 106 | 0 | 22 | 38 | 40 | 3 |
| 7 | 70 | 107 | 0 | 23 | 48 | 41 | 3 |
| 8 | 80 | 108 | 0 | 24 | 17 | 42 | 4 |
| 9 | 90 | 109 | 0 | 25 | 27 | 43 | 4 |
| 10 | 100 | 110 | 0 | 26 | 37 | 44 | 4 |
| 11 | 110 | 111 | 0 | 27 | 47 | 45 | 4 |
| 12 | 120 | 112 | 0 | 28 | 12 | 46 | 5 |
| 13 | 18 | 31 | 1 | 29 | 22 | 47 | 5 |
| 14 | 28 | 32 | 1 | 30 | 32 | 48 | 5 |
| 15 | 38 | 33 | 1 | 31 | 42 | 49 | 5 |

SINGLE COMPARATOR EXPONENTIAL-SCALE PWM DIMMING

FIELD OF THE DISCLOSURE

This document relates to integrated circuits and in particular to circuits for driving a circuit load that includes light emitting diodes.

BACKGROUND

Switching regulator circuits may be used to provide a regulated voltage to drive a circuit load. An example is using a switching regulator circuit to drive light emitting didoes (LEDs). The intensity of light emitted by an LED is proportional to the amount of current flowing through it. However, there are problems associated with changing the amount of current flowing through an LED linearly to change LED brightness. The human eye perceives brightness over a wide dynamic range better represented by a logarithmic than a linear scale. Changing the LED brightness linearly does not appear to the human eye to be a smooth transition in brightness. Changes in brightness on a logarithmic scale look more natural.

SUMMARY OF THE DISCLOSURE

This document relates generally to switching regulator circuits and methods of their operation. In some aspects, an exponential-scale pulse width modulation (PWM) controller includes a waveform generator circuit configured to generate a logarithmic waveform signal that has the shape of an increasing logarithm function; and a first comparator circuit including a first input to receive the logarithmic waveform signal, a second input to receive a PWM reference signal, and an output that provides a PWM control signal that includes signal pulses having a duty cycle that changes exponentially with the input signal.

In some aspects, a method of operating a PWM circuit includes generating a logarithmic waveform signal that has the shape of an increasing logarithm function; receiving an input signal; generating a PWM control signal by applying the logarithmic waveform signal and the PWM reference signal to a comparator circuit, wherein the PWM control signal includes pulses having a duty cycle that changes exponentially; and controlling brightness of one or more light emitting diodes (LEDs) using the PWM control signal.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 5A and 5B show an example of an algorithm useful to implement a logarithmic waveform signal in an aspect.

DETAILED DESCRIPTION

Switching regulator circuits may be used to provide a regulated voltage or current to drive a circuit load such as an LED or a string of LEDs. Perceived intensity can be controlled by rapidly flashing the LED on and off, thereby adjusting the time-averaged current. This avoids color shifts associated with analog dimming (in which the current through the LEDs is continuous) and improves the range over which the LEDs may be dimmed. Switching regulators for driving LED lighting loads frequently provide a PWM dimming feature to control the brightness of the attached LEDs. The duty cycle of this PWM dimming is typically linearly proportional to an input value. However, changing the brightness of an LED linearly does not appear to the human eye to be a smooth transition in brightness. An improved technique is to vary the intensity of the LED logarithmically to provide what appears to be a smooth transition in LED brightness. An approach to provide an exponentially varying drive signal is to use exponential scale PWM to control the LED drive.

Figure 1:
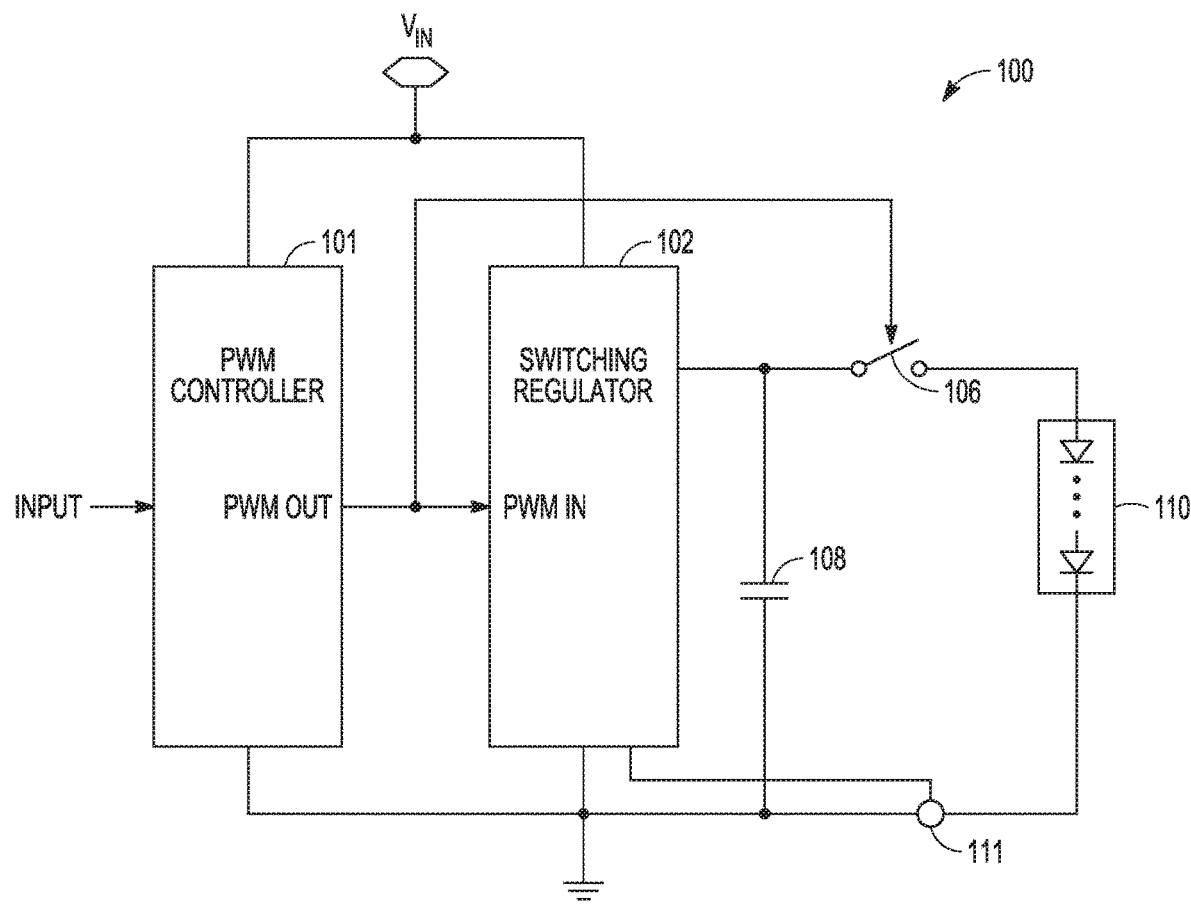
FIG. 1 is a block diagram of an example of an LED driver system in an aspect.

FIG. 1 is a block diagram of an example of an LED driver system 100. The system 100 can include a PWM controller circuit 101, a switching regulator circuit 102 circuit, and a PWM switch 106. The switching regulator circuit 102 can provide a regulated current to drive an LED load 110. In some aspects, the switching regulator circuit 102 can include a switching power converter circuit, such as a buck converter circuit, a boost converter circuit, a buck-boost converter circuit, a Ćuk converter circuit, or other switched mode power converter circuit. The switching power converter circuit includes switches to alternately charge an inductor using a circuit input (VIN) and discharge energy stored in the inductor to a circuit load filtered by the output capacitor. An output voltage or output current can be fed back to control the switching to provide a regulated output.

The switching regulator circuit 102 contains a controller which produces a PWM signal used to operate its internal switches to produce a regulated constant current to drive the LEDs of the LED load. The regulation may include feedback of the output current sensed using current sensor 111. The switches of switching regulator circuit 102 operate with frequencies of hundreds of kilohertz (kHz) to around two megahertz (2 MHz).

Separate from the switching regulator circuit 102, the PWM controller circuit 101 can provide a PWM control signal (PWM OUT) having a duty cycle or "ON" time that can be adjusted to control the brightness of the LEDs. During the "ON" time, the switching regulator circuit 102 is providing current to the LED load 110. The frequency of this PWM control signal is much slower than the switching frequency of the regulator (e.g., 100 Hz to 1 kHz). The PWM control signal drives the switch 106 to cause rapid flashing of the LEDs. The frequency of the PWM cycle is still fast enough that an average observer's eye is incapable of discerning the on/off PWM duty cycling of the LED load 110. The switching regulator circuit 102 may suspend regulating its output during the duty cycle "OFF" time of the PWM control signal. This may be done for example by suspending feedback based on the current or by powering down at least a portion of the switching regulator circuit 102.

The LEDs appear brighter for a longer duty cycle or longer "ON" time, and dimmer for a shorter duty cycle or shorter on time. Changing the duty cycle of the PWM control signal logarithmically can provide transitions on brightness that appear to be smooth to the human eye. Logarithmically shortening the duty cycle of the PWM control signal can provide dimming of the LEDs that appears smooth. This technique provides control of the LED brightness by controlling the time-averaged current rather than the amount of continuous current such as the control by the switching regulator circuit 102.

Figure 2:
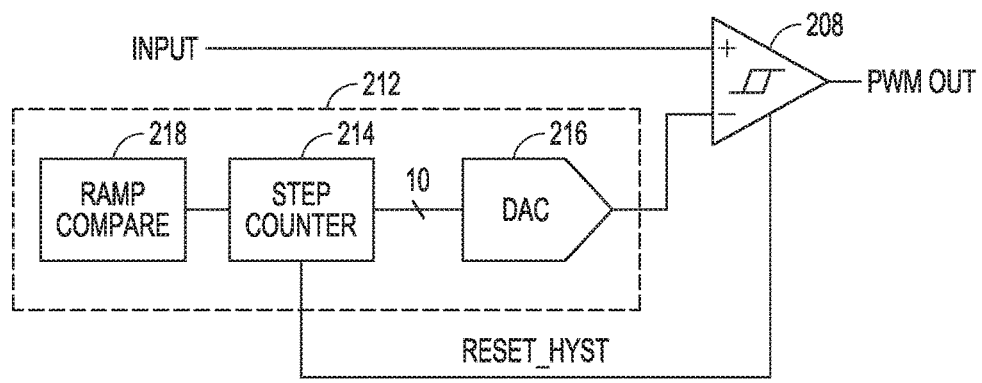
FIG. 2 is a block diagram of an example of a pulse width modulation (PWM) controller circuit in an aspect.

FIG. 2 is a block diagram of an example of a PWM controller circuit 201 that can produce a PWM control signal in which the duty cycle of the PWM pulses changes exponentially. The PWM Controller circuit 201 includes a comparator circuit 208 and a waveform generator circuit 212. The waveform generator circuit 212 generates a logarithmic waveform signal that has the shape of an increasing logarithm.

Figure 3:
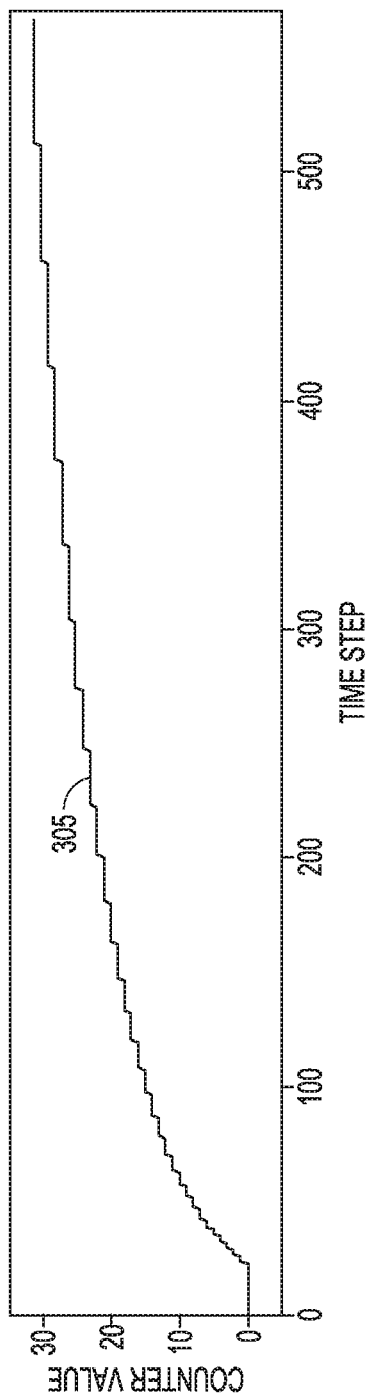
FIG. 3 is a graph of one period of a logarithmic waveform signal in an aspect.

FIG. 3 is a graph of one period or one cycle of the logarithmic waveform signal 305. It can be seen in the graph that the waveform can be viewed as a ramp that is logarithmically shaped. The logarithmic waveform signal 305 increases in steps and the time between steps increases linearly with time.

Returning to FIG. 2, an input signal (INPUT) is compared to the logarithmic waveform signal 305 using the comparator circuit 208. The input is applied to one input of the comparator circuit 208 and the logarithmic waveform signal 305 is applied to the other input of the comparator circuit 208. In some examples, the input signal is a fixed value or a slowly changing waveform. In some examples, the input signal can be a square wave waveform. The square wave may be an independently generated PWM signal. The high value of the square wave is higher than the maximum value of the logarithmic waveform, and the low value of the square wave is lower than the minimum value of the logarithmic waveform. The output (PWM OUT) of the comparator circuit 208 is high when the input signal is greater than the logarithmic waveform signal 305.

When the input is between the minimum and maximum values of the logarithmic waveform signal 305, the logarithmic waveform signal 305 has the same frequency as the output PWM signal. The PWM "ON" times correspond to when the input signal is greater than the logarithmic waveform signal 305, and the PWM "OFF" times correspond to when the input signal is less than the logarithmic waveform signal 305. This causes the duty cycle of the output signal (PWM OUT) to be exponential with respect the input signal (INPUT) and dim the light emitted by the LED load 110.

In some aspects, the logarithmic waveform signal 305 increases as a logarithm from an initial amplitude (e.g., zero) after an initial delay. This initial delay or hold-off period sets the starting point of the exponential scaling and avoids the portion of the logarithmic function that falls below zero.

The waveform generator circuit 212 includes a step counter circuit 214 and a digital-to-analog converter (DAC) circuit 216. The step counter circuit 214 increases in binary steps but the time between the increments increases linearly. The count output from the step counter circuit 214 is provided to the DAC circuit 216 which converts the output of the step counter circuit 214 to an analog waveform to produce the logarithmic waveform signal 305 of FIG. 3.

The waveform generator circuit 212 includes a ramp compare component 218 to control the timing of the counting of the step counter circuit 214 so that the time between counts increases linearly. In some examples, the ramp compare component 218 uses analog ramp signals to control the timing of the counting of the step counter circuit 214.

Figure 4:
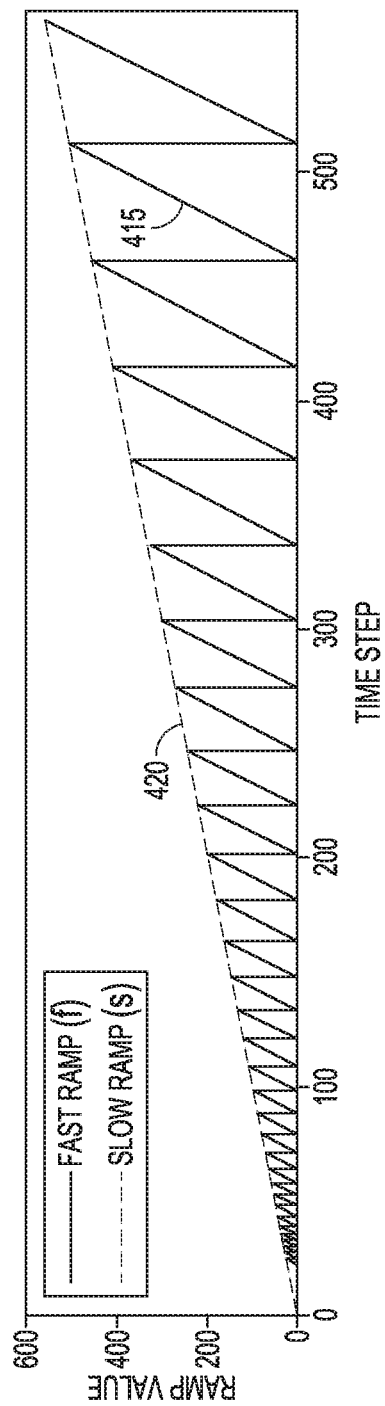
FIG. 4 is a graph of an example of two ramp signal waveforms in an aspect.

FIG. 4 is a graph of an example of two ramp signal waveforms; a fast ramp signal 415 and a slow ramp signal 420. The fast ramp signal shows repeating ramps while just one ramp is shown for the slow ramp signal 420. The fast ramp signal 415 has a ramp slope greater than the slow ramp signal 420 and ramps faster than the slow ramp signal. The slow ramp signal may start increasing from an initial amplitude value greater than zero.

The two ramp signals are applied to a comparator circuit different from the comparator circuit 208 in FIG. 2. When the amplitude of the slow ramp signal is greater than the amplitude of the fast ramp signal, the output of the comparator is low. When the amplitude of the fast ramp signal becomes greater than the amplitude of the slow ramp signal, the output of the comparator goes high. Logic circuitry can then be used to reset the amplitude of the fast ramp signal 415 back to zero. The transitions of the comparator can be used to increment the counter circuit 214 of FIG. 2. Because the amplitude of the slow ramp signal is increasing, the time needed for the fast ramp signal to exceed the slow ramp signal also increases; thereby increasing the time between counts of the step counter circuit 214. This can be seen in the time between steps of the logarithmic waveform signal 305 of FIG. 3.

The ramp signals can be generated using ramp circuits. For example, the fast ramp signal can be approximated by charging a smaller sized capacitor and the slow ramp signal can be approximated by charging a larger sized capacitor. The charge on the smaller capacitor can be recurrently returned to ground or another voltage whenever the charge on the smaller capacitor exceeds the charge on the larger capacitor. The charging of the larger capacitor may start from a predetermined charge to provide an initial amplitude greater than zero volts to the second ramp signal.

In some examples, the ramp compare component 218 includes two counter circuits to control the timing of the counting of the step counter circuit 214. One counter circuit outputs a faster ramping count and the other counter circuit outputs a slower ramping count. The faster ramp count increases faster than the slower ramp count. Conceptually, this is a digital signal implementation of the two analog ramp signal approach. The faster ramping count is the fast ramp signal 415 in FIG. 4 and the slower ramping count is the slow ramp signal 420. The waveform generator circuit 212 includes logic circuitry to increment the count of the step counter circuit 214 when the faster ramping count exceeds the slower ramping count and reset the faster ramping count when the faster ramping count exceeds the slower ramping count. In some examples, the slower ramping count starts from a non-zero count.

In some examples, one or both of the ramp compare component 218 and the step counter 214 are implemented using a processor (e.g., a microprocessor or application specific integrated circuit (ASIC)) performing an algorithm to implement the fast ramping, the slow ramping, and the step count. FIG. 5A is an example of pseudo-code for the algorithm and FIG. 5B shows a table of results of the algorithm. The shaded rows indicate where the fast ramp f exceeds the slow ramp s and the step count Out is increased.

Returning to FIG. 2, the step counter circuit 214 and DAC circuit 216 may be high precision circuits (e.g., the step counter circuit 214 may be a ten-bit counter and the DAC circuit 216 may be a ten-bit DAC). The high precision allows for a small step size in the count when generating the logarithmic waveform 305. The small step size prevents the perception of flicker when the input PWM reference signal (PWM IN) is near the boundaries between DAC codes. With smaller steps, flicker due to dither between adjacent steps is less likely to be perceived and less likely to be a source of noise.

The comparator circuit 208 can include hysteresis in the switching of the output. After one cycle or period of the logarithmic waveform is completed, the step counter circuit 214 may send a signal (RESET-HYST) to reset the hysteresis of the comparator.

Figure 6:
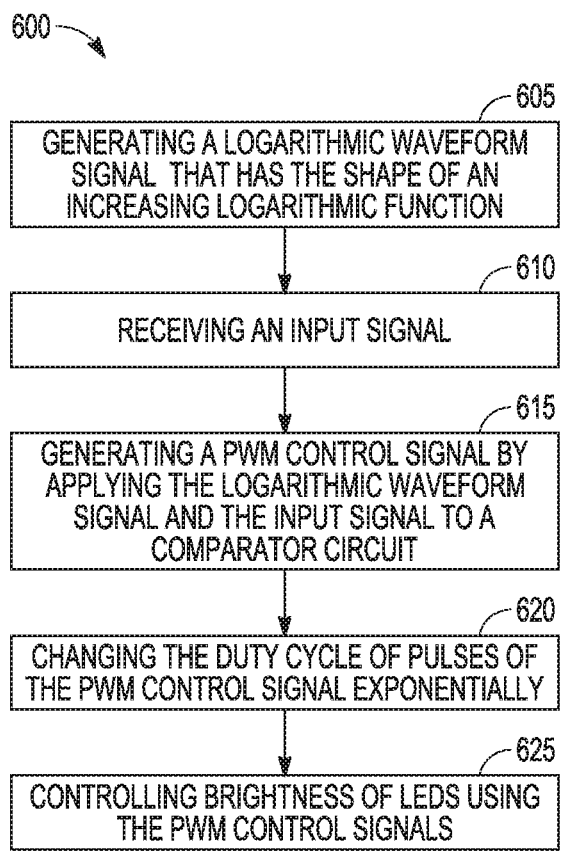
FIG. 6 is a flow diagram of a method of operating a PWM circuit.

FIG. 6 is a flow diagram of a method of operating a pulse width modulation (PWM) circuit. The PWM circuit can include a PWM controller, such as the PWM controller circuit 101 of FIG. 1.

At 605, a logarithmic waveform signal is generated. The logarithmic waveform signal has the shape of an increasing logarithmic function. The logarithmic waveform signal can be generated using any of the examples of a waveform generator circuit as described herein. At 610, the PWM controller receives an input signal. The input signal can be an external PWM input or an analog input signal. In an example, the PWM controller is used to dim a car taillight that doubles as a brake light. The signal might be held at one value and toggled to another, higher value, when the brake pedal is pressed, and might immediately or gradually decrease to zero once the car is switched off.

At 615, a PWM control signal is generated by applying the logarithmic waveform signal and the input signal to a comparator circuit. At 620, the duty cycle of pulses of the PWM control signal change exponentially with respect to the duty cycle of the input signal.

At 625, the PWM signal is used to change the brightness of an LED load. The duty cycle of pulses of the PWM control signal may decrease exponentially to dim the LEDs. In some examples, a switching regulator circuit drives a circuit load that includes one or more LEDs. The PWM control signal may enable and disable the regulation of the switching regulator circuit.

The devices and methods described herein drive LED circuit while providing transitions that appear smooth to the human eye. The devices and methods also manage flicker due to electrical noise. In PWM drive approaches, flicker can be perceived when the input PWM value nears the boundaries between DAC codes. With the small step sizes of the techniques described herein, flicker due to dither between adjacent steps is less likely to be noticeable and less likely to be the dominant source of noise in the PWM duty ratio.

Peak sensitivity to flicker may occur near 10 Hz, and no sensitivity may occur above a flicker fusion threshold; near 100 Hz for a stationary source. To push fine fluctuations out of the critical range, a dither in the DAC circuit by a single least significant bit (LSB) value from PWM cycle to PWM cycle may be introduced.

ADDITIONAL DESCRIPTION AND ASPECTS

A first Aspect (Aspect 1) includes subject matter (such as a pulse width modulation (PWM) controller) comprising a waveform generator circuit configured to generate a logarithmic waveform signal that has the shape of an increasing logarithm function; and a first comparator circuit including a first input to receive the logarithmic waveform signal, a second input to receive an input signal, and an output that provides a PWM control signal that includes signal pulses having a duty cycle that changes exponentially with respect to the input signal.

In Aspect 2 the subject matter of Aspect 1 optionally includes a waveform generator configured to, for each period of the logarithmic waveform signal, increase the logarithmic waveform signal as a logarithm from an initial amplitude after an initial delay at the initial amplitude.

In Aspect 3, the subject matter of one or both of Aspects 1 and 2 optionally includes a waveform generator that includes a first counter circuit configured to increment a count and linearly increase a time between increments of the count; and a digital-to-analog converter (DAC) circuit configured to convert the count of the first counter circuit into the logarithmic waveform sign.

In Aspect 4, the subject matter of one or any combination of Aspects 1-3 optionally includes a first ramp circuit configured to output a first repeating ramp signal; a second ramp circuit configured to output a second ramp signal, wherein a ramp slope of the first repeating ramp signal is greater than a ramp slope of the second ramp signal; and a second comparator circuit configured to produce an increment signal to increment the first counter circuit when an amplitude of the first repeating ramp signal exceeds an amplitude of the second ramp signal.

In Aspect 5, the subject matter of one or any combination of Aspects 1-4 optionally includes a waveform generator circuit including logic circuitry configured to reset the amplitude of the first repeating ramp signal when the amplitude of the first repeating ramp signal exceeds the amplitude of the second ramp signal; and start the amplitude of the second ramp signal at an initial amplitude value greater than zero.

In Aspect 6, the subject matter of one or any combination of Aspects 1-3 optionally includes a waveform generator including a second counter circuit configured to output a faster ramping count; a third counter circuit configured to output a slower ramping count, wherein the faster ramping count increases faster than the slower ramping count; and logic circuitry configured to increment the count of the first counter circuit when the faster ramping count exceeds the slower ramping count; and reset the faster ramping count when the faster ramping count exceeds the slower ramping count.

In Aspect 7, the subject matter of Aspect 6 optionally includes the third counter circuit configured to start the slower ramping count at an initial count greater than zero.

In Aspect 8, the subject matter of one or both of Aspects 6 and 7 optionally include a processor configured to implements the first, second and third counter circuits.

In Aspect 9, the subject matter of one or any combination of Aspects 3-8 optionally includes a DAC circuit having at least ten bits.

Aspect 10 includes subject matter (such as a method of operating a PWM circuit) or can optionally be combined with one or any combination of Aspects 1-9 to include such subject matter comprising generating a logarithmic waveform signal that has the shape of an increasing logarithm function; receiving an input signal; generating a PWM control signal by applying the logarithmic waveform signal and the input signal to a comparator circuit, wherein the PWM control signal includes pulses having a duty cycle that changes exponentially with respect to a duty cycle of the input signal; and controlling brightness of at least one light emitting diode using the PWM control signal.

In Aspect 11, the subject matter of Aspect 10 optionally includes generating a first repeating ramp signal and a second ramp signal, wherein a ramp slope of the first repeating ramp signal is greater than a ramp slope of the second ramp signal; incrementing a first counter circuit when an amplitude of the first repeating ramp signal exceeds an amplitude of the second ramp signal; and converting the output of the first counter circuit to an analog signal using a digital-to-analog converter (DAC) circuit.

In Aspect 12, the subject matter of Aspect 11 optionally includes resetting an amplitude of the first repeating ramp signal when the amplitude of the first repeating ramp signal exceeds the amplitude of the second ramp signal; and resetting the amplitude of the second ramp signal when the first counter circuit reaches a predetermined maximum count.

In Aspect 13, the subject matter of one or both of claims 11 and 12 optionally includes generating the first repeating ramp signal using a second counter circuit; generating the second ramp signal using a third counter circuit; and incrementing the first counter circuit and resetting the count of the second counter circuit when the count of the second counter circuit exceeds the count of the third counter circuit.

In Aspect 14, the subject matter of one or any combination of Aspects 11-13 optionally includes generating the first repeating ramp signal using a first ramp circuit; generating the second ramp signal using a second ramp circuit, wherein an output signal of the first ramp circuit has a greater slope than an output signal of the second ramp circuit; and incrementing the first counter circuit and resetting an output of the first ramp circuit when an amplitude of the output signal of the first ramp circuit exceeds an amplitude of the output signal of the second ramp circuit.

In Aspect 15, the subject matter of one or any combination of Aspects 10-14 optionally includes generating the logarithmic waveform signal to increase as a logarithm from an initial amplitude after an initial delay.

In Aspect 16, the subject matter of one or any combination of Aspects 10-15 optionally includes providing a regulated output to the at least one LED using the switching regulator circuit during an on time of the PWM control signal; and suspending regulating by the switching regulator circuit during an off time of the PWM control signal.

Aspect 17 includes subject matter (such as an LED driver circuit) or can optionally be combined with one or any combination of Aspects 1-16 to include such subject matter, comprising a switching regulator circuit configured to produce a regulated output according to pulse width modulation (PWM) to drive one or more LEDs and an exponential PWM controller operatively coupled to the switching regulator circuit. The exponential PWM controller includes a waveform generator circuit configured to generate a logarithmic waveform signal having a shape of a logarithm function that increases from an initial amplitude after an initial delay; and a first comparator circuit including a first input to receive the logarithmic waveform signal, a second input to receive an input signal, and an output that provides a PWM control signal that includes signal pulses having a duty cycle that changes exponentially.

In Aspect 18, the subject matter of Aspect 17 optionally includes a waveform generator circuit including a first counter circuit configured to increment a count and linearly increase a time between increments of the count; and a digital-to-analog converter (DAC) circuit configured to convert the count of the first counter circuit into the logarithmic waveform signal.

In Aspect 19, the subject matter of Aspect 18 optionally includes a waveform generator circuit including a first ramp circuit configured to output a first repeating ramp signal; a second ramp circuit configured to output a second ramp signal, wherein a ramp slope of the first repeating ramp signal is greater than a ramp slope of the second ramp signal; and a second comparator circuit configured to produce an increment signal to increment the first counter circuit when an amplitude of the first repeating ramp signal exceeds an amplitude of the second ramp signal.

In Aspect 20, the subject matter of one or both of Aspects 18 and 19 optionally includes a second counter circuit configured to output a first ramping count; a third counter circuit configured to output a second ramping count, wherein the first ramping count increases faster than the second ramping count; and logic circuitry configured to increment the count of the first counter circuit when the first ramping count exceeds the second ramping count; and reset the first ramping count when the first ramping count exceeds the second ramping count.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples" or "aspects." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An exponential-scale pulse width modulation (PWM) controller, the PWM controller comprising
    a waveform generator circuit configured to generate a logarithmic waveform signal that has the shape of an increasing logarithm function, wherein, for each period of the logarithmic waveform signal, the logarithmic waveform signal increases as a logarithm from an initial amplitude after an initial delay at the initial amplitude; and
    a first comparator circuit including a first input to receive the logarithmic waveform signal, a second input to receive an input signal, and an output that provides a PWM control signal that includes signal pulses having a duty cycle that changes exponentially with respect to the input signal.

2. The PWM controller of claim 1, wherein the waveform generator circuit includes:
    a first counter circuit configured to increment a count and linearly increase a time between increments of the count; and
    a digital-to-analog converter (DAC) circuit configured to convert the count of the first counter circuit into the logarithmic waveform signal.

3. The PWM controller of claim 2, wherein the waveform generator circuit includes:
    a first ramp circuit configured to output a first repeating ramp signal;
    a second ramp circuit configured to output a second ramp signal, wherein a ramp slope of the first repeating ramp signal is greater than a ramp slope of the second ramp signal; and
    a second comparator circuit configured to produce an increment signal to increment the first counter circuit when an amplitude of the first repeating ramp signal exceeds an amplitude of the second ramp signal.

4. The PWM controller of claim 3, wherein the waveform generator circuit includes logic circuitry configured to:
    reset the amplitude of the first repeating ramp signal when the amplitude of the first repeating ramp signal exceeds the amplitude of the second ramp signal; and
    start the amplitude of the second ramp signal at an initial amplitude value greater than zero.

5. The PWM controller of claim 2, wherein the waveform generator circuit includes:
    a second counter circuit configured to output a faster ramping count;
    a third counter circuit configured to output a slower ramping count, wherein the faster ramping count increases faster than the slower ramping count;
    logic circuitry configured to:
    increment the count of the first counter circuit when the faster ramping count exceeds the slower ramping count; and
    reset the faster ramping count when the faster ramping count exceeds the slower ramping count.

6. The PWM controller of claim 5, wherein the third counter circuit is configured to start the slower ramping count at an initial count greater than zero.

7. The PWM controller of claim 5, including a processor configured to implements the first, second and third counter circuits.

8. The PWM controller of claim 2, wherein the DAC circuit has at least 10 bits.

9. A method of operating a pulse width modulation (PWM) circuit, the method comprising:
    generating a logarithmic waveform signal that has the shape of an increasing logarithm function and increases as a logarithm from an initial amplitude after an initial delay;
    receiving an input signal;
    generating a PWM control signal by applying the logarithmic waveform signal and the input signal to a comparator circuit, wherein the PWM control signal includes pulses having a duty cycle that changes exponentially with respect to a duty cycle of the input signal; and
    controlling brightness of at least one light emitting diode using the PWM control signal.

10. The method of claim 9, wherein generating the logarithmic waveform signal includes:
    generating a first repeating ramp signal and a second ramp signal, wherein a ramp slope of the first repeating ramp signal is greater than a ramp slope of the second ramp signal;
    incrementing a first counter circuit when an amplitude of the first repeating ramp signal exceeds an amplitude of the second ramp signal; and
    converting the output of the first counter circuit to an analog signal using a digital-to-analog converter (DAC) circuit.

11. The method of claim 10,
    resetting an amplitude of the first repeating ramp signal when the amplitude of the first repeating ramp signal exceeds the amplitude of the second ramp signal; and
    resetting the amplitude of the second ramp signal when the first counter circuit reaches a predetermined maximum count.

12. The method of claim 10, wherein the generating the first repeating ramp signal and the second ramp signal includes:
    generating the first repeating ramp signal using a second counter circuit;
    generating the second ramp signal using a third counter circuit; and
    wherein the incrementing the first counter circuit includes incrementing the first counter circuit and resetting the count of the second counter circuit when the count of the second counter circuit exceeds the count of the third counter circuit.

13. The method of claim 10, wherein the generating the first repeating ramp signal and the second ramp signal includes:
    generating the first repeating ramp signal using a first ramp circuit;
    generating the second ramp signal using a second ramp circuit, wherein an output signal of the first ramp circuit has a greater slope than an output signal of the second ramp circuit; and
    wherein the incrementing the first counter circuit includes incrementing the first counter circuit and resetting an output of the first ramp circuit when an amplitude of the output signal of the first ramp circuit exceeds an amplitude of the output signal of the second ramp circuit.

14. The method of claim 9, including:
providing a regulated output to the at least one LED using the switching regulator circuit during an on time of the PWM control signal; and
suspending regulating by the switching regulator circuit during an off time of the PWM control signal.

15. A light emitting diode (LED) driver circuit comprising:
a switching regulator circuit configured to produce a regulated output according to pulse width modulation (PWM) to drive one or more LEDs; and
an exponential PWM controller operatively coupled to the switching regulator circuit and including:
a waveform generator circuit configured to generate a logarithmic waveform signal having a shape of a logarithm function that increases from an initial amplitude after an initial delay; and
a first comparator circuit including a first input to receive the logarithmic waveform signal, a second input to receive an input signal, and an output that provides a PWM control signal that includes signal pulses having a duty cycle that changes exponentially.

16. The LED driver circuit of claim 15, wherein the waveform generator circuit includes:
a first counter circuit configured to increment a count and linearly increase a time between increments of the count; and
a digital-to-analog converter (DAC) circuit configured to convert the count of the first counter circuit into the logarithmic waveform signal.

17. The LED driver circuit of claim 16, wherein the waveform generator circuit includes:
a first ramp circuit configured to output a first repeating ramp signal;
a second ramp circuit configured to output a second ramp signal, wherein a ramp slope of the first repeating ramp signal is greater than a ramp slope of the second ramp signal; and
a second comparator circuit configured to produce an increment signal to increment the first counter circuit when an amplitude of the first repeating ramp signal exceeds an amplitude of the second ramp signal.

18. The LED driver circuit of claim 16, wherein the waveform generator circuit includes:
a second counter circuit configured to output a first ramping count;
a third counter circuit configured to output a second ramping count, wherein the first ramping count increases faster than the second ramping count;
logic circuitry configured to:
increment the count of the first counter circuit when the first ramping count exceeds the second ramping count; and
reset the first ramping count when the first ramping count exceeds the second ramping count.

* * * * *